US 9,773,825 B2

(12) United States Patent
Hirase et al.

(10) Patent No.: US 9,773,825 B2
(45) Date of Patent: Sep. 26, 2017

(54) SOLID-STATE IMAGING DEVICE AND METHOD OF MANUFACTURING THE DEVICE

(71) Applicant: Panasonic Intellectual Property Management Co., Ltd., Osaka (JP)

(72) Inventors: Junji Hirase, Osaka (JP); Yoshiyuki Matsunaga, Kyoto (JP); Yoshihiro Sato, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/565,212

(22) Filed: Dec. 9, 2014

(65) Prior Publication Data

US 2015/0090998 A1    Apr. 2, 2015

Related U.S. Application Data

(63) Continuation of application No. PCT/JP2013/002960, filed on May 8, 2013.

(30) Foreign Application Priority Data

Jun. 26, 2012    (JP) .................. 2012-143136

(51) Int. Cl.
  *H01L 23/48*    (2006.01)
  *H01L 27/146*   (2006.01)
  (Continued)

(52) U.S. Cl.
  CPC .... *H01L 27/14614* (2013.01); *H01L 27/1461* (2013.01); *H01L 27/1464* (2013.01);
  (Continued)

(58) Field of Classification Search
  CPC .......... H01L 27/14614; H01L 27/1461; H01L 27/14612; H01L 27/1464; H01L 27/14645; H01L 27/14641; H01L 27/14669
  See application file for complete search history.

(56) References Cited

U.S. PATENT DOCUMENTS 7,863,661 B2 *    1/2011    Katsuno ............ H01L 27/14603
                                                                     257/258
2008/0029793 A1    2/2008    Watanabe et al.
(Continued)

FOREIGN PATENT DOCUMENTS

| JP | 2002-170982 A | 6/2002 |
| JP | 2006-041056 A | 2/2006 |
| JP | 2011-054746 A | 3/2011 |

OTHER PUBLICATIONS

International Search Report issued in International Application No. PCT/JP2013/002960 dated Jul. 23, 2013, with English translation.

*Primary Examiner* — Nicholas Tobergte
(74) *Attorney, Agent, or Firm* — McDermott Will & Emery LLP

(57) ABSTRACT

Each unit pixel includes a photoelectric converter formed above a semiconductor region, an amplifier transistor formed in the semiconductor region, and including a gate electrode connected to the photoelectric converter, a reset transistor configured to reset a potential of the gate electrode, and an isolation region formed in the semiconductor region between the amplifier transistor and the reset transistor to electrically isolate the amplifier transistor from the reset transistor. The amplifier transistor includes a source/drain region. The source/drain region has a single source/drain structure.

15 Claims, 8 Drawing Sheets

(51) Int. Cl.
  *H04N 5/363* (2011.01)
  *H04N 5/378* (2011.01)
  *H01L 51/42* (2006.01)

(52) U.S. Cl.
  CPC .. *H01L 27/14612* (2013.01); *H01L 27/14641* (2013.01); *H01L 27/14645* (2013.01); *H01L 27/14669* (2013.01); *H01L 51/428* (2013.01); *H04N 5/363* (2013.01); *H04N 5/378* (2013.01)

(56) References Cited

U.S. PATENT DOCUMENTS

| | | | |
|---|---|---|---|
| 2008/0185502 A1* | 8/2008 | Koyama | H03K 19/14 250/214 LS |
| 2009/0128224 A1 | 5/2009 | Toyoshima | |
| 2010/0025569 A1 | 2/2010 | Matsumoto et al. | |
| 2011/0049665 A1 | 3/2011 | Goto | |
| 2011/0115003 A1* | 5/2011 | Okita | H01L 27/14632 257/291 |
| 2011/0157447 A1 | 6/2011 | Watanabe et al. | |
| 2011/0240835 A1 | 10/2011 | Sawayama et al. | |
| 2012/0104479 A1 | 5/2012 | Matsumoto et al. | |
| 2013/0107095 A1* | 5/2013 | Yarino | H01L 27/14609 348/302 |
| 2015/0123180 A1* | 5/2015 | Sato | H04N 5/363 257/292 |

* cited by examiner

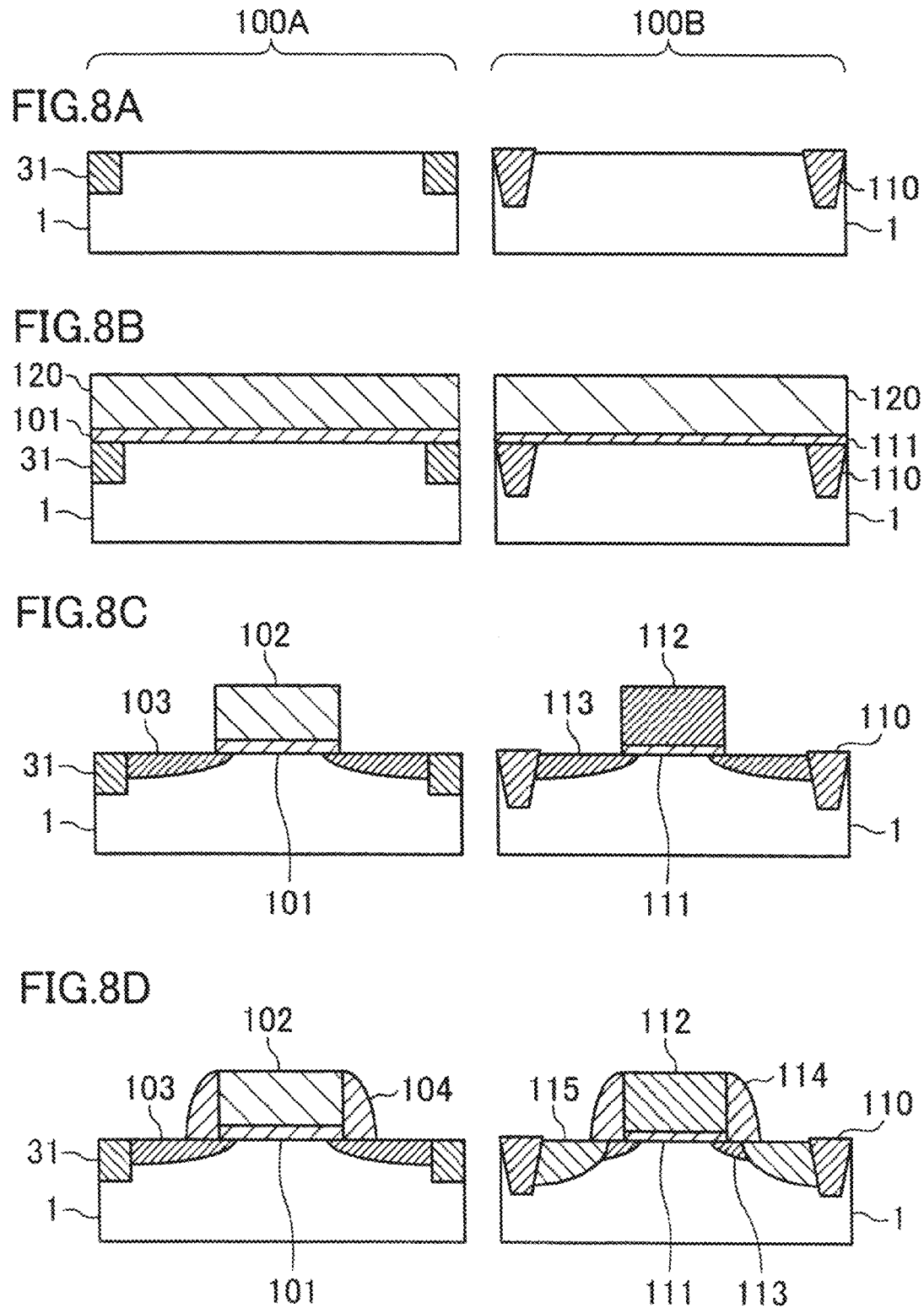

SOLID-STATE IMAGING DEVICE AND METHOD OF MANUFACTURING THE DEVICE

CROSS-REFERENCE TO RELATED APPLICATIONS

This is a continuation of International Application No. PCT/JP2013/002960 filed on May 8, 2013, which claims priority to Japanese Patent Application No. 2012-143136 filed on Jun. 26, 2012. The entire disclosures of these applications are incorporated by reference herein.

BACKGROUND

The present invention relates to solid-state imaging devices and methods of manufacturing the solid-state imaging devices.

In reducing cell sizes to 1 μm or smaller in conventional metal oxide semiconductor (MOS) image sensors, reduction in the thicknesses of photo diodes for preventing mixed colors (crosstalk) degrades light absorption efficiency and reduces the number of saturated electrons. To address the problems, Japanese Unexamined Patent Publication No. 2011-054746 suggests a multilayer image sensor, in which a photoelectric conversion film is stacked on a semiconductor (e.g., crystal silicon) substrate including a pixel circuit with an insulating film interposed between the substrate and the conversion film.

In multilayer image sensors, photoelectric conversion films are made of a material with a higher light absorption coefficient such as an amorphous silicon or an organic film. Since no photo diode is buried in a semiconductor substrate, mixed colors can be reduced. In addition, the capacity of photoelectric converters increases, thereby increasing the number of saturated electrons.

SUMMARY

However, in the solid-state imaging device shown in the above-described Japanese Unexamined Patent Publication No. 2011-054746, a transmission line transmitting signal charges photoelectrically converted by the photoelectric conversion film is, as a plug, directly connected to the pn junction in the silicon substrate, that is, a floating diffusion (FD) and the gate of an amplifier transistor. The plug is, for example, made of polysilicon. Thus, the charges of leakage currents from the FD (hereinafter referred to as FD leakages) are indistinguishable from the photoelectrically converted signal charges and become noise to degrade the performance of the image sensor. That is, the noise caused by the leakage currents from transistors formed in a pixel region (i.e., pixel transistors) increases, thereby degrading a signal-to-noise (SN) ratio and eventually degrading sensitivity.

In view of the problem, the present disclosure provides a solid-state imaging device which reduces leakage currents in pixel transistors.

A solid-state imaging device according to an aspect of the present disclosure includes a semiconductor region of a first conductivity type, and a plurality of unit pixels arranged in the semiconductor region. Each of the unit pixels includes a photoelectric converter formed above the semiconductor region, an amplifier transistor formed in the semiconductor region, and including a gate electrode connected to the photoelectric converter, a reset transistor formed in the semiconductor region, and configured to reset a potential of the gate electrode of the amplifier transistor, and an isolation region formed in the semiconductor region between the amplifier transistor and the reset transistor to electrically isolate the amplifier transistor from the reset transistor. The isolation region is made of a material forming the semiconductor region. The amplifier transistor includes a source/drain region of a second conductivity type. The source/drain region has a single source/drain structure.

A solid-state imaging device according to another aspect of the present disclosure includes a plurality of unit pixels arranged in a semiconductor region of a first conductivity type, and a peripheral circuit located in a peripheral region of the plurality of unit pixels, and including a plurality of peripheral transistors. Each of the unit pixels includes a photoelectric converter formed above the semiconductor region, an amplifier transistor formed in the semiconductor region, and including a gate electrode connected to the photoelectric converter, and a reset transistor formed in the semiconductor region, and configured to reset a potential of the gate electrode of the amplifier transistor. The transistors of the unit pixels in the semiconductor region are isolated by an impurity diffusion layer, and the transistors of the peripheral circuit are isolated by an insulating film.

A method of manufacturing a solid-state imaging device according to an aspect of the present disclosure includes sequentially forming a gate insulating film and a silicon film on a semiconductor region, selectively implanting impurities into a pixel formation region of the formed silicon film, forming a first gate electrode from the silicon film of the pixel formation region, forming a first source/drain region in the pixel formation region of the semiconductor region using the first gate electrode as a mask, the first source/drain region containing impurities at a first concentration, forming a second gate electrode from the silicon film of a peripheral circuit formation region in the semiconductor region, and forming a second source/drain region in the peripheral circuit formation region of the semiconductor region using the second gate electrode as a mask, the second source/drain region containing impurities at a second concentration higher than the first concentration. The first source/drain region has a single source/drain structure.

The solid-state imaging device and the method of manufacturing the device according to the present disclosure reduce leakage currents in pixel transistors.

BRIEF DESCRIPTION OF THE DRAWINGS

FIG. 5A is a cross-sectional view taken along the line Va-Va of FIG. 4. FIG. 5B is a cross-sectional view taken along the line Vb-Vb of FIG. 4.

FIG. 6A is a cross-sectional view taken along the line VIa-VIa of FIG. 4. FIGS. 6B and 6C are cross-sectional views taken along the line VIbc-VIbc of FIG. 4.

FIGS. 8A-8D are schematic cross-sectional views illustrating a method of manufacturing the solid-state imaging device according to the second embodiment in order of steps.

DETAILED DESCRIPTION

Embodiments of the present disclosure will be described hereinafter with reference to the drawings. The present disclosure is not limited to the following embodiments. Changes and modifications can be made within the scope of the present disclosure. One embodiment may be combined with other embodiments.

First Embodiment

Figure 1:
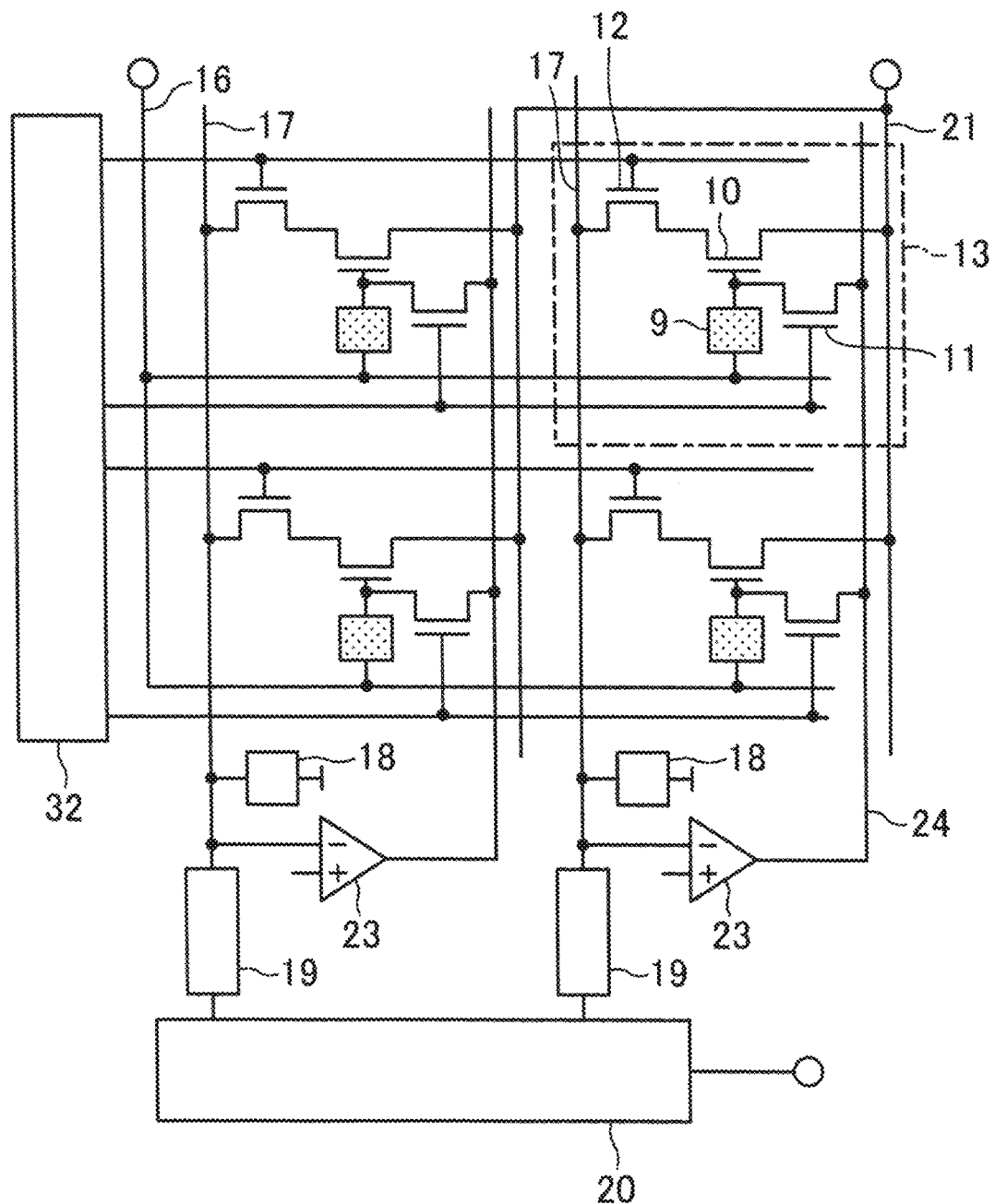
FIG. 1 is a circuit diagram illustrating a solid-state imaging device according to a first embodiment.

FIG. 1 illustrates the circuit configuration of a solid-state imaging device according to a first embodiment.

As shown in FIG. 1, the solid-state imaging device according to the first embodiment includes a photosensitive region (i.e., a pixel region) formed by arranging a plurality of unit pixels 13 in a matrix on a semiconductor substrate, and a drive circuit as a peripheral circuit sequentially driving the plurality of unit pixels 13 to extract photoelectrically converted signals.

The drive circuit includes a vertical scanner (row scan circuit) 32, a horizontal signal reader (column scan circuit) 20, a photoelectric converter control line 16, vertical signal lines (vertical signal interconnects) 17 connected to the horizontal signal reader 20 via column signal processors (row signal chargers) 19, loads 18 connected to the vertical signal lines 17, a power supply line (source follower power supply) 21 supplying a predetermined power supply voltage to the unit pixels 13, and differential amplifiers (feedback amplifiers) 23 connected to the vertical signal lines 17 at respective negative input terminals, and connected to the unit pixels 13 at respective output terminals via feedback lines 24.

Each unit pixel (unit cell) 13 includes a photoelectric converter 9, an amplifier transistor 10, a reset transistor 11, and an address transistor (row selection transistor) 12. The photoelectric converter 9 photoelectrically converts incident light, and generates and accumulates signal charges corresponding to the amount of the incident light. The amplifier transistor 10 outputs a signal voltage corresponding to the amount of the signal charges generated by the photoelectric converter 9. The reset transistor 11 resets (initializes) the potential of the photoelectric converter 9, that is, a gate electrode of the amplifier transistor 10. The address transistor 12 selectively outputs a signal voltage from the corresponding unit pixel 13 of a predetermined row to the corresponding vertical signal line 17.

The vertical scanner 32 applies row selection signals controlling on/off of the address transistors 12 to the gate electrodes of the address transistors 12, thereby scanning the rows of the unit pixels 13 in the vertical direction (i.e., the column direction). Then, the vertical scanner 32 selects one of the rows of the unit pixels 13 to output the signal voltage to the corresponding vertical signal line 17. The vertical scanner 32 applies reset signals controlling on/off of the reset transistors 11 to the gate electrodes of the reset transistors 11, thereby selecting one of the rows of the unit pixels 13 to perform reset operation.

The photoelectric converter control line 16 is connected in common to all of the unit pixels 13, and applies the same constant positive voltage to all of the photoelectric converters 9.

The vertical signal lines 17 correspond to the columns of the unit pixels 13. The vertical signal lines 17 are connected to source regions of the address transistors 12 of the unit pixels 13 of the corresponding columns. The vertical signal lines 17 are aligned in the column direction and transmit signal voltages in the column direction (i.e., the vertical direction.)

Each of the loads 18 is connected to a corresponding one of the vertical signal lines 17. Each load 18 forms a source follower circuit together with the amplifier transistor 10.

The column signal processors 19 performs noise suppression represented by correlated double sampling, analog-to-digital conversion, etc. Each of the column signal processors 19 is connected to a corresponding one of the vertical signal lines 17.

The horizontal signal reader 20 sequentially reads signals of the plurality of column signal processors 19 aligned in the horizontal direction (i.e., the row direction) on a common horizontal signal line (not shown).

The power supply line 21 is connected to drain regions of the amplifier transistors 10 and provided in the vertical direction (i.e., the vertical direction in FIG. 1) of the unit pixels 13 in the photosensitive region. The power supply line 21 applies a source follower power supply voltage to the amplifier transistors 10 of all of the unit pixels 13 in common.

The differential amplifiers 23 correspond to the columns of the unit pixels 13. The output terminal of each differential amplifier 23 is connected to drain regions of the reset transistors 11 via the corresponding feedback line 24. When the address transistors 12 and the corresponding reset transistor 11 are on, the differential amplifier 23 receives the output value of the address transistor 12 at a negative terminal, and performs feedback operation such that the gate potential of the amplifier transistor 10 is a predetermined feedback voltage (i.e., the output voltage of the differential amplifier 23). At this time, the output voltage of the differential amplifier 23 is a positive voltage, i.e., 1 V or close to 1 V.

In the solid-state imaging device with the above-described configuration, in the unit pixels 13 of one row selected by the vertical scanner 32, the signal charges photoelectrically converted by the photoelectric converters 9 are amplified by the amplifier transistors 10 and output to the corresponding vertical signal line 17 via the address transistors 12.

The output signal charges are accumulated as electric signals in the corresponding column signal processor 19, and then selected and output by the horizontal signal reader 20. The signal charges of the unit pixels 13, which have output the signals, are released when the reset transistors 11 are on. At this time, the reset transistors 11 generate great thermal noise called "kTC noise." This thermal noise turns the reset transistors 11 off, and remains at the start of accumulating the signal charges. In order to reduce the thermal noise, the output values of the vertical signal lines 17 are inverted and amplified by the differential amplifiers 23, and the inverted and amplified signals are fed back to the drain regions of the reset transistors 11 via the feedback lines 24.

As such, negative feedback control reduces the thermal noise generated by the reset transistors 11. Out of the thermal noise, the AC component is fed back to the drain regions of the reset transistors 11, and the DC component has, as described above, the positive voltage close to 1 V.

Figure 2:
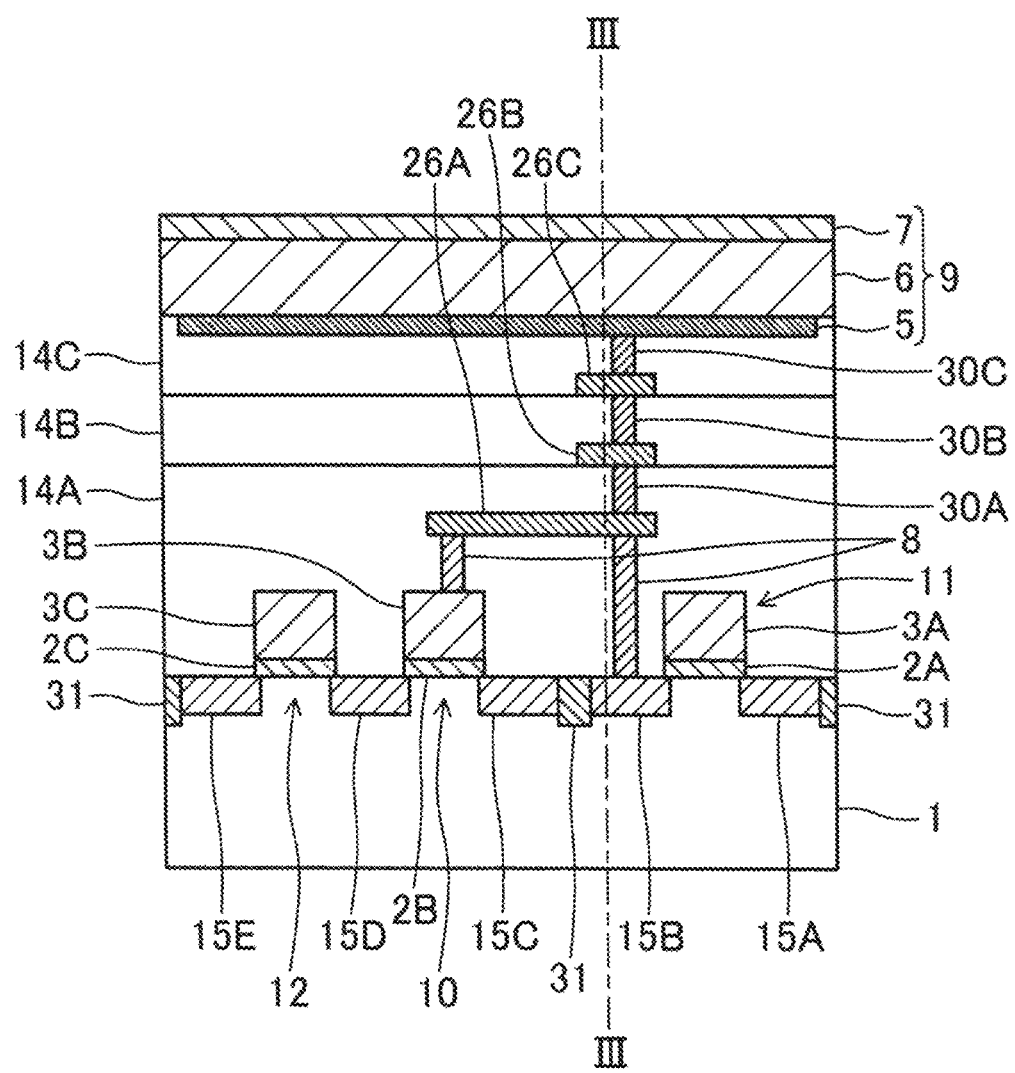
FIG. 2 is a schematic cross-sectional view illustrating a unit pixel in the solid-state imaging device according to the first embodiment.

FIG. 2 illustrates the schematic cross-sectional structure of one of the unit pixels 13 in the solid-state imaging device according to this embodiment, in which the pixel transistors are of p-ch type. Three transistors are shown in one cross-section to simplify the description, which is different from the actual structure.

The unit pixel 13 includes, for example, a pixel circuit of three transistors formed on the semiconductor substrate 1 made of n-type silicon (Si), that is, the address transistor 12, the amplifier transistor 10, and the reset transistor 11. The unit pixel 13 further includes, an isolation region 31, interlayer insulating films 14A, 14B, and 14C stacked on the semiconductor substrate 1 in this order, and the photoelectric converter 9. The photoelectric converter 9 includes a pixel electrode 5 in an upper portion of the interlayer insulating film 14C, a photoelectric conversion film 6 formed on the pixel electrode 5, and a transparent electrode 7 formed on the photoelectric conversion film 6.

In the unit pixel 13, the reset transistor 11 includes p-type source/drain regions 15A and 15B formed in upper portions of the semiconductor substrate 1, and a gate insulating film 2A and a gate electrode 3A formed on and above the semiconductor substrate 1. Similarly, the amplifier transistor 10 includes p-type source/drain regions 15C and 15D formed in upper portions of the semiconductor substrate 1, and a gate insulating film 2B and a gate electrode 3B formed on and above the semiconductor substrate 1. The address transistor 12 includes p-type source/drain regions 15D and 15E formed in upper portions of the semiconductor substrate 1, and a gate insulating film 2C and a gate electrode 3C formed on and above the semiconductor substrate 1.

The isolation region 31 is an impurity diffusion region which insulates and isolates the transistors 10 and 12 from the transistor 11. For example, the isolation region 31 is formed between and around the amplifier transistor 10 and the reset transistor 11 in an upper portion of the semiconductor substrate 1 to electrically isolate the amplifier transistor 10 from the reset transistor 11. The isolation region 31 is an n-type diffusion region with an impurity concentration of about $5 \times 10^{17}$ cm$^{-3}$. That is, the isolation region 31 is formed by diffusion isolation.

The impurity concentration of the semiconductor substrate 1 is, for example, about $1 \times 10^{17}$ cm$^{-3}$. The impurity concentrations of the p-type source/drain regions 15A, 15B, 15C, 15D, and 15E range from about $1 \times 10^{18}$ cm$^{-3}$ to about $5 \times 10^{19}$ cm$^{-3}$. The p-type source/drain regions 15A, 15B, 15C, 15D, and 15E have what is called a single source/drain structure containing impurities at a concentration equal to that of conventional low-concentration source/drains. The thicknesses of the gate insulating films 2A, 2B, and 2C respectively formed under the gate electrodes 3A, 3B, and 3C range from 4 nm to 10 nm.

The photoelectric conversion film 6 is made of an organic material, amorphous silicon, etc., and formed above the semiconductor substrate 1 to photoelectrically convert incident light from the outside. The pixel electrode 5 is in contact with the surface of the photoelectric conversion film 6, which is closer to the semiconductor substrate 1, that is, on the back surface of the photoelectric conversion film 6 to collect the signal charges generated in the photoelectric conversion film 6. The transparent electrode 7 is in contact with the surface of the photoelectric conversion film 6, which is opposite to the pixel electrode 5, that is, on the front surface of the photoelectric conversion film 6. A constant positive voltage is applied to the transparent electrode 7 via the photoelectric converter control line 16. The signal charges generated in the photoelectric conversion film 6 are read on the pixel electrode 5.

The amplifier transistor 10 is a p-ch MOS transistor formed in the semiconductor substrate 1 below the pixel electrode 5. The amplifier transistor 10 includes the gate electrode 3B connected to the pixel electrode 5, and outputs a signal voltage corresponding to the potential of the pixel electrode 5.

The reset transistor 11 is a p-ch MOS transistor formed in the semiconductor substrate 1 below the pixel electrode 5. The reset transistor 11 includes the p-type source/drain region 15B connected to the pixel electrode 5 and formed in the region of the semiconductor substrate 1 between the gate electrode 3A and the isolation region 31. The reset transistor 11 resets the potential of the gate electrode 3B of the amplifier transistor 10 to a reset voltage, that is, a feedback voltage.

The address transistor 12 is a p-ch MOS transistor formed in the semiconductor substrate 1 below the pixel electrode 5. The address transistor 12 is provided between the amplifier transistor 10 and the vertical signal line 17, and outputs a signal voltage from the unit pixel 13 to the vertical signal line 17. While the address transistor 12 is interposed between the source/drain region of the amplifier transistor 10 and the vertical signal line 17, it may be interposed between the source/drain region of the amplifier transistor 10 and the power supply line 21.

The gate electrode 3B of the amplifier transistor 10 as well as the p-type source/drain region 15B of the reset transistor 11 are connected to the pixel electrode 5 via contact plugs 8, an interconnect 26A, a plug 30A, an interconnect 26B, a plug 30B, an interconnect 26C, and a plug 30C.

In this embodiment, the pn junction between the p-type source/drain region 15B and the semiconductor substrate 1 forms a parasitic diode (accumulation diode) accumulating signal charges. The accumulation diode is a floating diffusion (FD). The p-type source/drain region 15B is also hereinafter referred to as an FD 15B.

Figure 3:
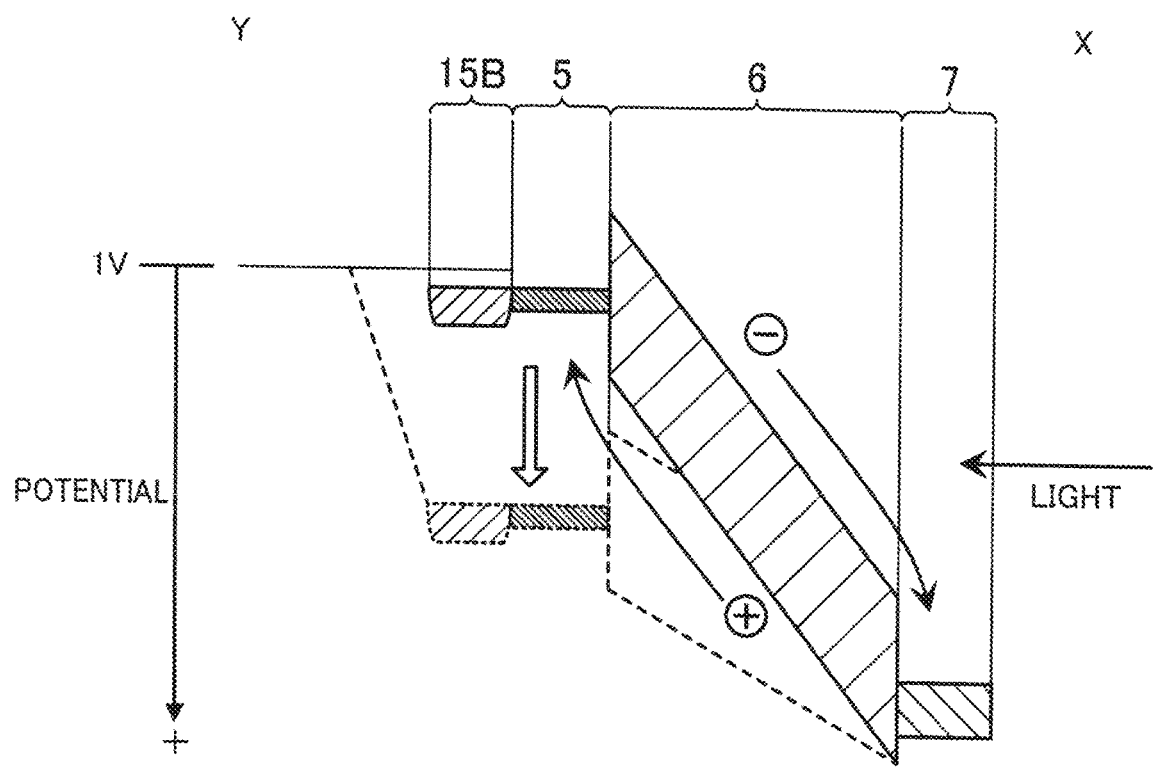
FIG. 3 is a schematic view illustrating the potential of the unit pixel according to the first embodiment at the portion along the line of FIG. 2.

FIG. 3 schematically illustrates the potential of the unit pixel 13, specifically, the potential of the portion along the line of FIG. 2.

As shown in FIG. 3 and as described above, the positive voltage is applied to the transparent electrode 7. In a no-signal state (in a reset state), a reverse bias voltage is applied to the FD 15B being an accumulation diode, and the potential of the FD 15B is almost 1 V. At this time, the positive voltage of the transparent electrode 7 draws the potential of the pixel electrode 5 and the p-type source/drain region 15B in the positive direction. In this state, when the FD 15B has low potential close to 1 V, a bias charge is applied to the FD 15B.

The light incident from a portion above the transparent electrode 7 (i.e., from the X direction) is transmitted by the transparent electrode 7, incident on the photoelectric conversion film 6, and converted to electron-hole pairs. The electrons of the converted electron-hole pairs are transferred toward the transparent electrode 7 and flow to the power supply line 21 connected to the transparent electrode 7. On the other hand, the holes of the electron-hole pairs are transferred to the FD 15B being the accumulation diode and accumulated in the FD 15B. Thus, the potential of the FD 15B changes to positive, and a voltage is applied between the FD 15B and the semiconductor substrate 1. At this time, the reverse direction leakage current (i.e., a dark current) flows between the 15B and the semiconductor substrate 1 and becomes noise. However, where a signal exists, noise is neither significant nor problematic.

The voltage, which has been changed to positive by the holes accumulated in the accumulation diode, is transmitted to the gate electrode 3B of the amplifier transistor 10. The signal transmitted to the gate electrode 3B and amplified by the amplifier transistor 10 passes through the address transistor 12 and is output to the outside of the unit pixel 13, that is, to the vertical signal line 17. After that, the signal charge accumulated in the accumulation diode is released by turning on the reset transistor 11. At this time, the gate electrode 3B of the amplifier transistor 10 is reset to have a voltage lower than the voltage applied to the transparent electrode 7.

The solid-state imaging device according to this embodiment requires a signal charge time one-digit longer than conventional MOS image sensors. There is thus a need to reduce leakages in accumulating, and differences in operational characteristics among the amplifier transistors 10.

Figure 4:
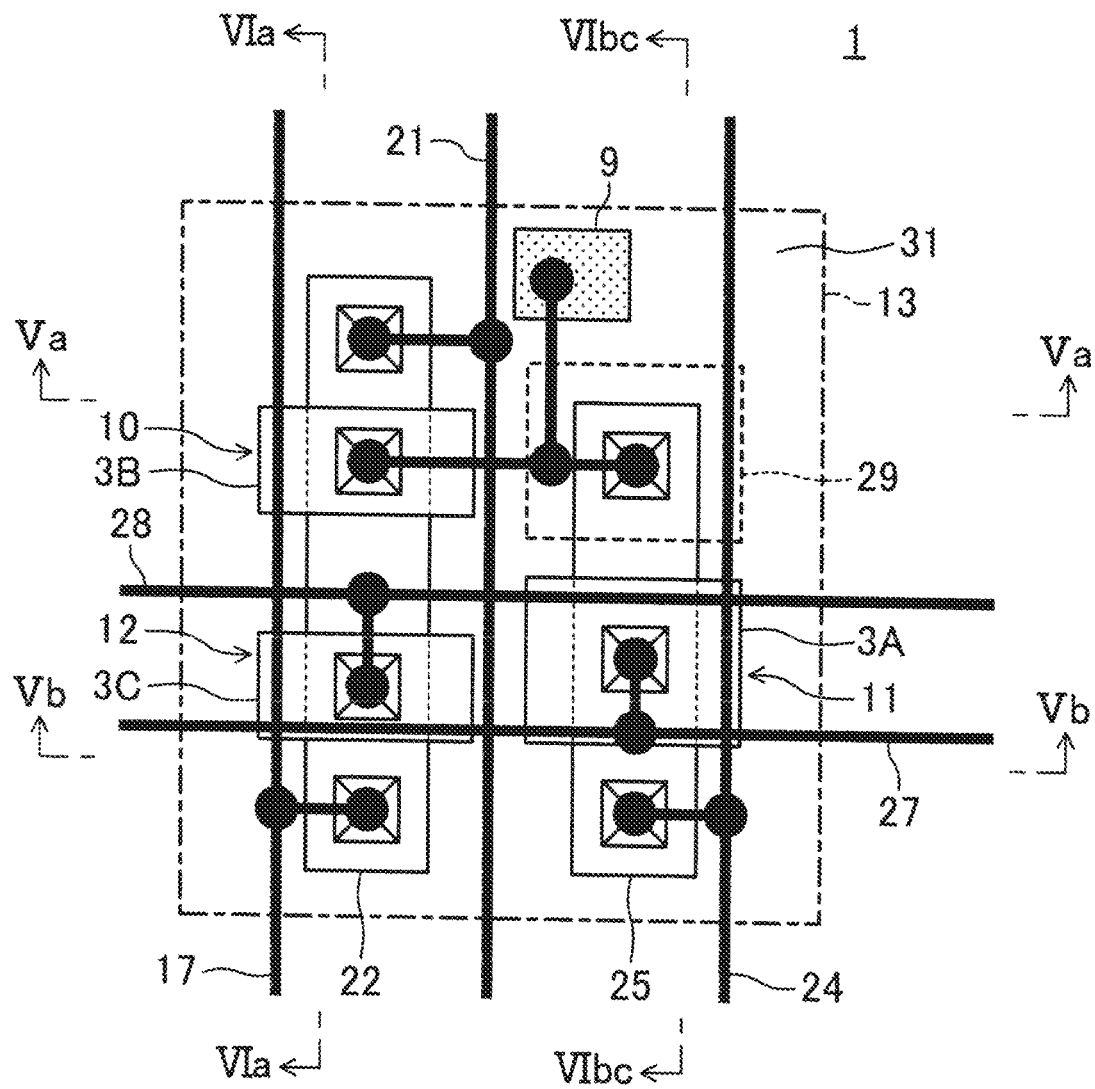
FIG. 4 is a schematic top view illustrating the configuration of the unit pixel according to the first embodiment.

FIG. 4 illustrates the configuration of each unit pixel 13 viewed in plan.

As shown in FIG. 4, in the unit pixel 13, the active regions of the amplifier transistor 10 and the address transistor 12 are formed in the semiconductor substrate 1 in a first active region 22 surrounded by the isolation region 31. The active region of the reset transistor 11 is formed in the semiconductor substrate 1 in a second active region 25 surrounded by the isolation region 31. The "active region" here includes the source region, the drain region, and the gate region (i.e., the channel region).

The source region of the address transistor 12 is connected to the vertical signal line 17. The gate electrode 3C is connected to an address signal line 28. The drain region of the amplifier transistor 10 is connected to the power supply line 21. The drain region of the reset transistor 11 is electrically connected to the gate electrode 3B of the amplifier transistor 10 and drawn to the portion above the semiconductor substrate 1 to be connected to the photoelectric converter 9. The reset transistor 11 is formed in the second active region 25 electrically isolated from the first active region 22. The source region of the reset transistor 11 is connected to the feedback line 24. The gate electrode 3A of the reset transistor 11 is connected to a reset signal line 27. A leakage current is problematic in a FD peripheral region 29.

Figure 5A:
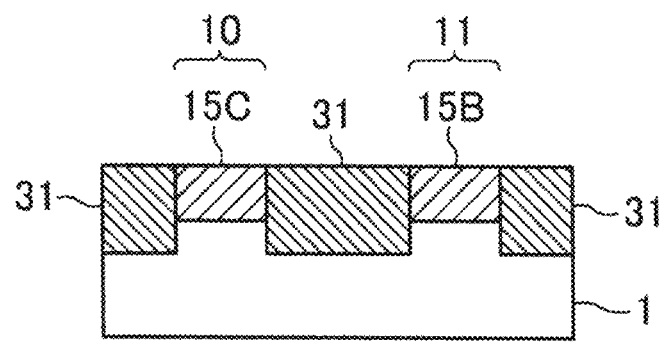
FIGS. 5A and 5B are schematic views of an isolation region of the unit pixel according to the first embodiment.
Figure 5B:
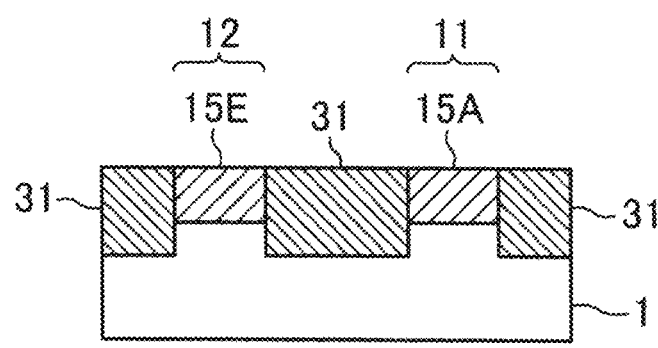

FIGS. 5A and 5B illustrate the schematic cross-sectional structure taken along the lines Va-Va and Vb-Vb of FIG. 4, respectively.

In this embodiment, the impurity concentrations of the p-type source/drain regions 15A, 15B, 15C, 15D, and 15E of the transistors 10, 11, and 12 are low, ranging from about $1 \times 10^{18}$ cm$^{-3}$ to about $5 \times 10^{19}$ cm$^{-3}$. This increases an isolation breakdown voltage among the elements, thereby reducing the impurity concentration of the isolation region 31 in the diffusion isolation. As a result, leakage currents between the FD 15B and the isolation region 31 decrease, that is, the FD leakages are reduced.

In the p-type source/drain regions 15A-15E of the transistors 10, 11, and 12, the regions in contact with the contact plugs (i.e., contact regions) may have a higher impurity concentration than the regions of the p-type source/drain regions 15A-15E except for the contact regions. This reduces contact resistance between the contact plugs and the p-type source/drain regions 15A-15E.

Furthermore, an n-type pinning layer (not shown) of an opposite conductivity type to that of the source/drain region 15B may be provided on almost the entire upper surface the p-type source/drain region 15B of the reset transistor 11. This reduces leakage currents in the p-type source/drain region 15B.

While the impurity concentrations of the p-type source/drain regions 15A-15E are the same, they may be different. In particular, affecting the FD leakages largely, the p-type source/drain region 15B serving as the FD preferably has a lower concentration than the other source/drain regions.

In order to reduce leakages to the semiconductor substrate 1, the profiles of the impurity concentrations of the p-type source/drain regions 15A-15E preferably vary gently. Thus, as shown in FIGS. 6A and 6B, all or part of the impurities regions of the p-type source/drain regions 15A-15E may have greater depths than the height of the corresponding gate electrodes 3A, 3B, and 3C.

Figure 6A:
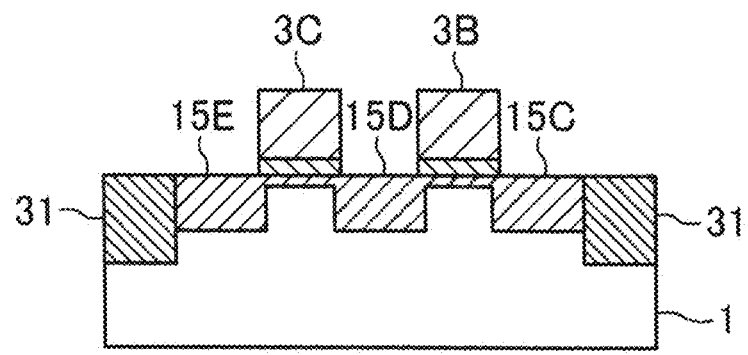
FIGS. 6A-6C are schematic views of a transistor of the unit pixel according to the first embodiment.
Figure 6B:
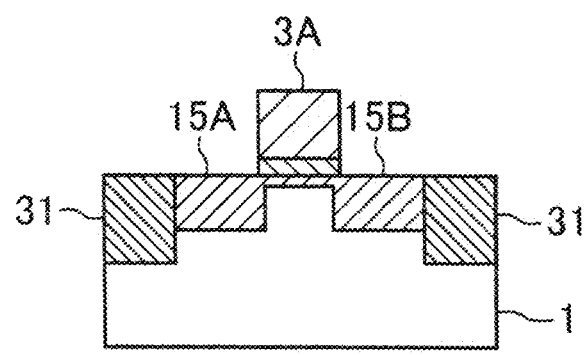

As shown in FIGS. 6A and 6B, the p-type impurities may be entirely implanted under all or part of the gate electrodes 3A-3C.

Figure 6C:
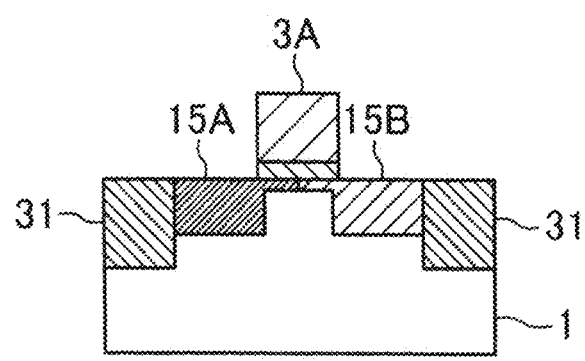

As shown in FIG. 6C, where the p-type impurities are implanted under the gate electrode 3A, the impurity concentration of the FD 15B may be different from the impurity concentrations of the other source/drain regions. For example, the impurity concentration of the FD 15B may be lower than the impurity concentrations of the other source/drain regions.

Where at least one of the amplifier transistor 10 or the address transistor 12 is a depletion transistor, the designed value of the channel width of the depletion transistor is preferably equal to the designed value of the width of the source/drain region. This is because the current path becomes linear, thereby removing a parasitic resistive component caused by the curve of the current path. Even when the designed values are equal, the channel width and the width of the source/drain region are not completely equal due to the differences in the impurity concentrations and the degree of effectiveness of the thermal treatment.

Next, details of the solid-state imaging device according to this embodiment will be described.

In conventional MOS image sensors, which includes a photo diode (PD) on a semiconductor substrate, all signal charges in the photo diode move to an accumulation diode (complete transfer). On the other hand, in a multilayer image sensor, thermal noise called kTC noise occurs in transfer or reset, which makes complete transfer of charges difficult. Thus, there is a need to provide a feedback circuit to cancel the thermal noise. As a result, 1/f noise of an amplifier transistor influences the image sensor many times. This 1/f noise of the amplifier transistor needs to be reduced.

In a multilayer image sensor, charges accumulated in an FD needs to be transferred rapidly when intense light is incident. Otherwise, the gate of an amplifier transistor is damaged. As a result, a film is subject to leakages and then charges become difficult to accumulate after then.

To address the problem, in the solid-state imaging device according to this embodiment, the transistors (pixel transistors) formed in each unit pixel 13 are of the p-ch type. The p-ch type is generally more resistant to 1/f noise than the n-ch type, thereby reducing 1/f noise of the amplifier transistor 10. In addition, when intense light is incident, a forward bias voltage is applied between the FD 15B and the semiconductor substrate 1, thereby rapidly transferring the accumulated charge to the semiconductor substrate 1.

On the other hand, since the pixel transistors are of the p-ch type, the potential difference at the pn junction between the FD 15B and the semiconductor substrate 1 is great when the light is weak (i.e., dark) and small when the light is intense (bright), which is different from an n-ch transistor.

Therefore, the p-ch pixel transistors are preferably combined with a structure reducing FD leakages.

In the solid-state imaging device according to this embodiment, the isolation in each pixel is made by diffusion isolation using a diffusion layer. This differs from isolation using an insulating film represented by conventional local oxidation of silicon (LOCOS) or shallow trench isolation (STI). That is, the diffusion isolation prevents the following problem. When a depletion layer, which is formed between the FD 15B and the semiconductor substrate 1 made of silicon, comes into contact with an insulating film for isolation, defects or dangling bonds around the insulating film enter the depletion layer, thereby causing great leakages.

As such, the diffusion isolation without forming any insulating film is employed in the solid-state imaging device according to this embodiment, thereby reducing leakage currents. In the diffusion isolation, a depletion layer expands in a diffusion isolation region for the isolation, which is in direct contact with the source/drain regions. At this time, the depletion layer tends to expand toward a portion with a smaller concentration. This reduces punch-through between the source/drain regions. As a result, the elements are miniaturized.

While in this embodiment, the pixel transistors are of the p-ch type, the pixel transistors in this solid-state imaging device according to this embodiment may be of the n-ch type. Alternatively, both the p-ch transistor and the n-ch transistor may exist. In the both cases, the advantages of the present disclosure are provided.

While in this embodiment, the transistors forming the pixel circuit are the MOS transistors, the present disclosure is not limited thereto as long as they are field effect transistors (FETs).

In this embodiment, the n-type semiconductor substrate 1 may be an n-type semiconductor region. For example, it may be an n-type well formed in a p-type semiconductor substrate.

This embodiment is applicable to conventional MOS image sensors.

As described above with reference to the drawings, in the solid-state imaging device according to the first embodiment, at least the source/drain regions 15A-15D of the amplifier transistor 10 and the reset transistor 11 have a single source/drain structure with a low concentration. This increases breakdown voltages between these source/drain regions and the source/drain regions of the other transistors. This lowers the concentration of the semiconductor substrate 1, thereby reducing FD leakages.

The diffusion isolation is employed as a structure for isolating the elements from each other in each unit pixel 13. This increases isolation breakdown voltages among the elements, which largely contributes to miniaturization in the pixels. This also lowers the concentration of the isolation region.

The above-described advantages are significant where the pixel transistors are of the p-ch type. This is because the potential difference at the pn junction between the FD 15B and the semiconductor substrate 1 increases in a dark time, thereby reducing FD leakages.

Second Embodiment

The structure and operation of a solid-state imaging device according to a second embodiment will be described hereinafter with reference to the drawings. Differences from the first embodiment will be described mainly.

Figure 7:
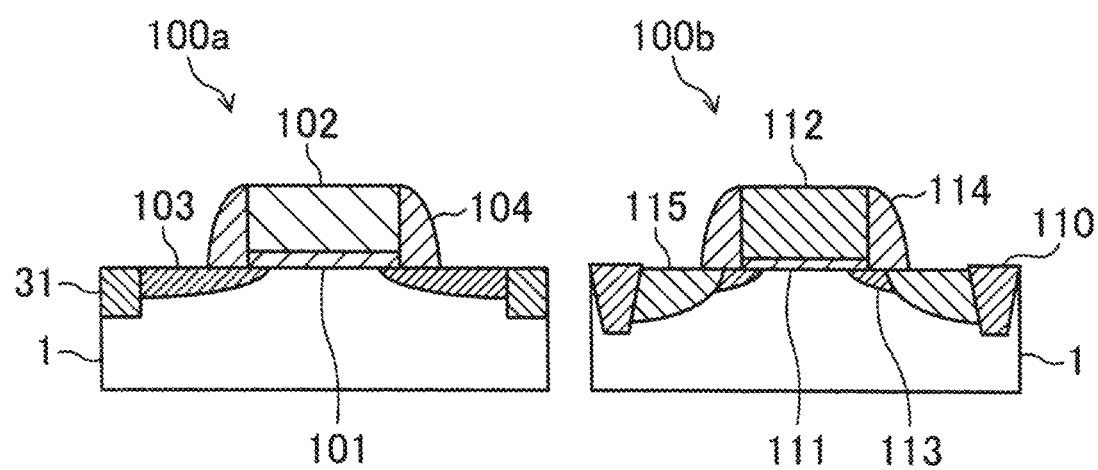
FIG. 7 is a schematic cross-sectional view illustrating a pixel transistor and a peripheral transistor in a solid-state imaging device according to a second embodiment.

FIG. 7 illustrates the schematic cross-sectional structure of transistors used in the solid-state imaging device according to the second embodiment. A pixel transistor 100a forming each unit pixel has a power supply voltage of, for example, 3 V, and insulated and isolated by an isolation region 31 in diffusion isolation. A gate electrode 102, which is made of polysilicon doped with impurities at a concentration of $1\times10^{21}$ cm$^{-3}$ or lower, is formed on the principal surface of a semiconductor substrate 1 with an gate insulating film 101 interposed therebetween. Insulating sidewalls 104 are formed on the both side surfaces of the gate electrode 102. A low-concentration source/drain region 103 is formed in an upper portion of the semiconductor substrate 1 at each side of the gate electrode 102. The inner ends of the source/drain regions 103 overlap the sides of the gate insulating film 101. The source/drain regions 103 have a single source/drain structure including a single impurity diffusion region at a concentration ranging from $1\times10^{18}$ cm$^{-3}$ to $5\times10^{19}$ cm$^{-3}$.

On the other hand, a peripheral transistor 100b is used in a peripheral circuit, which is located in the periphery of the pixel region. If the peripheral transistor 100b is of the same channel type as that of the pixel transistor 100a, the peripheral transistor 100b has a power supply voltage of, for example, 3 V. The peripheral transistor 100b is insulated and isolated by an STI isolation region 110. A gate electrode 112 made of polysilicon is formed on the principal surface of the semiconductor substrate 1 with a gate insulating film 111 interposed therebetween. Insulating sidewalls 114 are formed on the both side surfaces of the gate electrode 112. A low-concentration source/drain region 113 is formed in an upper portion of the semiconductor substrate 1 at each side of the gate electrode 112. The inner ends of the source/drain regions 113 overlap the sides of the gate insulating film 111. The source/drain regions 113 contain impurities at a concentration ranging from $1\times10^{18}$ cm$^{-3}$ to $5\times10^{19}$ cm$^{-3}$. A high-concentration source/drain region 115 is formed in an upper portion of the semiconductor substrate 1 at a side of each sidewall 114. The inner ends of the source/drain regions 115 overlap the lower ends of the sidewalls. The source/drain regions 115 contain impurities at a concentration of $1\times10^{18}$ cm$^{-3}$ to $5\times10^{19}$ cm$^{-3}$ or lower. The source/drain regions 115 and the low-concentration source/drain regions 113 form a dual source/drain structure.

The impurity concentration of the gate electrode 112 forming the peripheral transistor 100b is the sum of the impurity concentrations of the low-concentration source/drain regions 113 and the high-concentration source/drain regions 115 forming the peripheral transistor 100b. The impurity concentration of the gate electrode 112 is substantially equal to the impurity concentration of the high-concentration source/drain regions 115.

With this configuration, the impurity concentrations of the gate electrodes 112 in the peripheral transistors 100b are maintained at equivalent values. That is, the gate electrodes 112 of the peripheral transistors 100b obtain electrical conduction without increasing the impurity concentrations unnecessarily.

As compared to the pixel transistor 100a, the gate insulating film 111 of the peripheral transistor 100b has a smaller thickness. This improves the reliability of the gate insulating film 111 and reduces characteristic differences among the peripheral transistors 100b, in which there are concerns about degradation in the reliability of the gate insulating film 111 and an increase in characteristic differences due to the impurities leaking from the gate electrode 112 to the channel region.

Next, a method of manufacturing the solid-state imaging device according to the second embodiment, particularly a method of manufacturing the transistors will be described with reference to FIGS. 8A-8D.

First, as shown in FIG. 8A, the STI isolation region 110 is selectively formed in a peripheral circuit formation region 100B, which is the region for forming the peripheral transistor 100b, in the semiconductor substrate 1 made of n-type silicon. Then, predetermined well implantation and channel implantation are performed in a pixel formation region 100A, which is the region for forming the pixel transistor 100a, and the peripheral circuit formation region 100B. Impurities are implanted into the pixel formation region 100A to selectively form the isolation region 31 by diffusion isolation.

Next, as shown in FIG. 8B, the gate insulating film 101 is selectively formed on the semiconductor substrate 1 in the pixel formation region 100A. Then, the gate insulating film 111, which has a smaller thickness than the gate insulating film 101, is selectively formed on the semiconductor substrate 1 in the peripheral circuit formation region 100B. Then, a polysilicon film 120 is deposited on the entire surface of the semiconductor substrate 1. After that, boron (B) ions are selectively implanted into only the polysilicon film 120 deposited in the pixel formation region 100A at an acceleration energy of 3 keV with a dose of $1\times10^{15}$ cm$^{-2}$. That is, what is called gate implantation is performed.

After that, as shown in FIG. 8C, the polysilicon film 120 is patterned by dry etching, etc., thereby forming, from the polysilicon film 120, the gate electrode 102 in the pixel formation region 100A and the gate electrode 112 in the peripheral circuit formation region 100B. Then, B ions are selectively implanted into the pixel formation region 100A at an acceleration energy of 10 keV with a dose of $2\times10^{13}$ cm$^{-2}$ using the gate electrode 102 as a mask, thereby forming the low-concentration source/drain regions 103 for the pixel transistor 100a. Next, B ions are selectively implanted into the peripheral circuit formation region 100B at an acceleration energy of 10 keV with a dose of $5\times10^{13}$ cm$^{-2}$ using the gate electrode 112 as a mask, thereby forming the low-concentration source/drain regions 113 for the peripheral transistor 100b. The low-concentration source/drain regions 103 and 113 may be formed in any order.

Next, as shown in FIG. 8D, a silicon oxide film with a thickness of, for example, about 50 nm is deposited on the semiconductor substrate 1 to cover the gate electrodes 102 and 112. Then, the deposited silicon oxide film is etched back to form the sidewalls 104 and 114 on the both side surfaces of the gate electrodes 102 and 112 from the silicon oxide film. After that, B ions are selectively implanted into the peripheral circuit formation region 100B at an acceleration energy of 3 keV with a dose of $1\times10^{15}$ cm$^{-2}$ using the gate electrode 112 and the sidewalls 114 as a mask, thereby forming the high-concentration source/drain regions 115 for the peripheral transistor 100b. Then, predetermined thermal treatment is performed to activate the implanted B ions.

By the above-described steps, the solid-state imaging device shown in FIG. 7 is manufactured.

While in this embodiment, the B ions are implanted into the low-concentration source/drain regions 103 and 113 under different implantation conditions, the low-concentration source/drain regions 103 and 113 may be formed in the same step under the same conditions. While the gate implantation for the pixel transistor 100a and high-concentration source/drain implantation for the peripheral transistor 100b are performed under the same implantation conditions, the conditions may not necessarily be the same.

While in the step shown in FIG. 8C, the low-concentration source/drain regions 113 are formed in the peripheral transistor 100b, they do not necessarily have to be provided. Where no low-concentration source/drain region 113 is provided, it is sufficient to form only the high-concentration source/drain regions 115 without providing the sidewall 114.

While in the step shown in FIG. 8D, the sidewalls 104 are provided on the gate electrode 102 of the pixel transistor 100a, it may not necessarily be provided.

The solid-state imaging device and the method of manufacturing the device according to the present disclosure are particularly useful for small image pick up devices, etc.

What is claimed is:

1. A solid-state imaging device comprising:
   a semiconductor region of a first conductivity type;
   a plurality of unit pixels; and
   a peripheral circuit located in a peripheral region of the plurality of unit pixels, and including a plurality of peripheral transistors; and
   an insulating film isolating the plurality of peripheral transistors from each other, wherein
   each of the unit pixels includes
     a photoelectric converter above the semiconductor region,
     an amplifier transistor in the semiconductor region, including a gate electrode connected to the photoelectric converter,
     a reset transistor in the semiconductor region, configured to reset a potential of the gate electrode of the amplifier transistor, and
     an impurity diffusion layer isolating the amplifier transistor from the reset transistor.

2. The solid-state imaging device of claim 1, wherein the photoelectric converter includes a photoelectric conversion film containing an organic material.

3. The solid-state imaging device of claim 1, wherein a source/drain region of the amplifier transistor has a single source/drain structure.

4. The solid-state imaging device of claim 3, wherein the source/drain region contains impurities at a concentration lower than that of a source/drain region of each of the peripheral transistors.

5. The solid-state imaging device of claim 3, wherein
   the amplifier transistor is a depletion transistor, and
   a channel width of the amplifier transistor is substantially equal to a width of the source/drain region.

6. The solid-state imaging device of claim 3, wherein
   the amplifier transistor is a depletion transistor, and
   impurities implanted into the source/drain region are implanted into an entire lower surface of the gate electrode of the amplifier transistor.

7. The solid-state imaging device of claim 6, wherein the source/drain region contains a higher concentration of impurities at a portion being in contact with a contact than other portions.

8. The solid-state imaging device of claim 1, wherein the amplifier transistor and the reset transistor are of a p-channel type.

9. The solid-state imaging device of claim 1, wherein
   ones of the plurality of peripheral transistors are of a same channel type as the transistors included in the unit pixels,
   each of the ones of the plurality of peripheral transistors includes a gate electrode containing silicon, and has a dual source/drain structure of a first source/drain containing impurities at a first concentration, and a second source/drain disposed outside the first source/drain and containing impurities at a second concentration higher than the first concentration, and the gate electrodes of the peripheral transistors having the dual source/drain structure contain impurities at a concentration equal to the second concentration.

10. A solid-state imaging device comprising:
a semiconductor region of a first conductivity type;
a plurality of unit pixels; and
a peripheral circuit located in a peripheral region of the plurality of unit pixels, and including a plurality of peripheral transistors; and
an insulating film isolating the plurality of peripheral transistors from each other
an impurity diffusion layer in the semiconductor region, wherein
each of the unit pixels includes
  a photoelectric converter above the semiconductor region,
  an amplifier transistor in the semiconductor region, including a gate electrode connected to the photoelectric converter, and
  a reset transistor in the semiconductor region, configured to reset a potential of the gate electrode of the amplifier transistor,
  the amplifier transistor and the reset transistor being electrically isolated from each other by the impurity diffusion layer.

11. The solid-state imaging device of claim 1, wherein the insulating film is disposed in the semiconductor region.

12. The solid-state imaging device of claim 1, wherein the insulating film is a shallow trench isolation (STI) region.

13. The solid-state imaging device of claim 1, wherein the source/drain region contains impurities at a concentration of $5\times10^{19}$ cm$^{-3}$ or lower.

14. The solid-state imaging device of claim 10, wherein the insulating film is disposed in the semiconductor region.

15. The solid-state imaging device of claim 10, wherein the insulating film is a shallow trench isolation (STI) region.

* * * * *